United States Patent
Galarza et al.

(10) Patent No.: US 6,681,069 B2
(45) Date of Patent: Jan. 20, 2004

(54) SEMICONDUCTOR OPTICAL COMPONENT UTILIZING LEAKY STRUCTURES TO MATCH THE MODE OF RIB WAVEGUIDES TO THAT OF THE FIBER

(75) Inventors: Marko Galarza, Navarra (ES); Kurt De Mesel, Vleteren Belgie (BE); Candido Aramburu, Pamplona (ES); Roel Baets, Deinze (BE)

(73) Assignees: Interuniversitair Microelektronica Centrum, Leuven (BE); Universidad Publica de Navarra, Pamplona Navarra (ES); Universiteit Gent, Ghent (BE)

( * ) Notice: Subject to any disclaimer, the term of this patent is extended or adjusted under 35 U.S.C. 154(b) by 0 days.

(21) Appl. No.: 10/112,305

(22) Filed: Mar. 29, 2002

(65) Prior Publication Data

US 2003/0007766 A1 Jan. 9, 2003

Related U.S. Application Data

(60) Provisional application No. 60/279,953, filed on Mar. 29, 2001.

(51) Int. Cl.[7] .............................. G02B 6/26; G02B 6/10
(52) U.S. Cl. ........................... 385/50; 385/43; 385/129; 385/132
(58) Field of Search .............................. 385/27, 39, 43, 385/50, 129–132

(56) References Cited

U.S. PATENT DOCUMENTS

| | | | | |
|---|---|---|---|---|
| 6,108,478 A | * | 8/2000 | Harpin et al. | 385/129 |
| 6,363,188 B1 | * | 3/2002 | Alphonse | 385/37 |
| 6,438,279 B1 | * | 8/2002 | Craighead et al. | 385/12 |
| 6,600,864 B2 | * | 7/2003 | Samara-Rubio et al. | 385/131 |
| 2003/0068152 A1 | * | 4/2003 | Gunn, III | 385/129 |

FOREIGN PATENT DOCUMENTS

EP 0 545 820 A1 6/1993

OTHER PUBLICATIONS

T.L. Koch et al., "Antiresonant Reflecting Optical Waveguides for III–V Integrated Optics," *Electronic Letters*, vol. 23, No. 5, 1987.

T.L. Koch et al., "Tapered Waveguide InGaAsP Multiple Quantum Well Lasers," *IEEE Photonics Technology Letters*, vol. 2, No. 2, 1990.

Y. Shani et al., "Efficient Coupling of a Semiconductor Laser to an Optical Fiber by Means of a Tapered Waveguide on Silicon," *Appl. Phys. Lett.*, vol. 55, 1989.

R.N. Thurston et al., "Two–Dimensional Control of Mode Size in Optical Channel Waveguides by Lateral Channel Tapering," *Opt. Lett.*, vol. 16, No. 5, 1991.

* cited by examiner

*Primary Examiner*—John D. Lee
*Assistant Examiner*—Sarah U Song
(74) *Attorney, Agent, or Firm*—McDonnell Boehnen Hulbert & Berghoff

(57) ABSTRACT

A waveguide component has a slab waveguide, a rib waveguide, and a mode transition section where the rib waveguide and the slab waveguide are adjacent, and where the rib waveguide is tapered, to provide optical coupling, and lateral confinement rib waveguides are provided along the slab waveguide in the mode transition section to confine light from spreading laterally. The lateral confinement ribs can be formed in the same step with the same mask as used for the taper, to ensure alignment with the taper. They can be arranged either side of the taper. The lateral confinement ribs are significant for enabling a mode transition section which couples with low loss. In particular, it reduces the need for the taper to be so fine, or the taper to be made in both vertical and horizontal axes, both of which cause fabrication difficulties.

21 Claims, 9 Drawing Sheets

SEMICONDUCTOR OPTICAL COMPONENT UTILIZING LEAKY STRUCTURES TO MATCH THE MODE OF RIB WAVEGUIDES TO THAT OF THE FIBER

REFERENCE TO RELATED APPLICATIONS

This application claims priority benefits to the U.S. provisional application Ser. No. 60/279,953 filed on Mar. 29, 2001. This application incorporates by reference in its entirety U.S. provisional application Ser. No. 60/279,953 filed on Mar. 29, 2001.

FIELD OF THE INVENTION

This invention relates to integrated semiconductor devices and methods of making the same. In particular, the invention relates to devices incorporating optical waveguide structures as well as methods of manufacturing the same.

Description of the Related Art

Integrated optic devices are well suited to applications in such technologies as telecommunications, instrumentation, signal processing and sensors. An integrated optical circuit employs optical waveguides to implement devices, such as optical transmitters and receivers, switches and couplers. Waveguides also efficiently transmit light through the optical circuit and connect to external optical waveguides such as optical fibers, generally butt-coupled to the device. However, a mode mismatch exists between the semiconductor waveguide and the optical fiber. The former has typically a 1–2 $\mu$m elliptical modal spot, which is neither well-sized nor shaped to match the standard 8–9 $\mu$m circular modal spot of conventional single-mode optical fibers. Specifically, because the difference of the refractive index between the core and cladding of a typical waveguide is higher than that of a typical fiber, the optical field is more confined in the waveguide than in the fiber. In addition, waveguide core dimension is smaller than the fiber core dimension. Therefore, directly butt-coupled devices present 7–10 dB insertion loss. Nonintegrated solutions improve this coupling but present submicron alignment tolerances. To achieve both low coupling loss and large alignment tolerances, it is necessary to transform the mode on-chip to better match the fiber.

One first known solution is proposed in "Tapered waveguide InGaAs/InGaAsP multiple quantum well lasers" by T. L. Koch, U. Koren, G. Eisenstein, M. G. Young, M. Oron, C. R. Giles and B. I. Miller, IEEE Photon. Technol. Lett., Vol. 2, No. 2, February 1990. This document describes a semiconductor laser emitting a wide guided mode. A transition using a stepped change in vertical thickness of waveguide is shown. This laser is however complex to implement and fabricate.

A second known solution is proposed in "Efficient coupling of a semiconductor laser to an optical fiber by means of a tapered waveguide on silicon" by Y. Shani, C. H. Henry, R. C. Kistler, K. J. Orlowsky and D. A. Ackerman, Appl. Phys. Lett., Vol. 55, December 1989. The structure described in this document avoids any complex vertical tapering, however, it does require a regrowth to define a large rib over the substrate from which a first grown small rib has been removed. It further requires separate lateral definition for the large and small ribs.

A further solution is proposed in EP 0545820 A1 by P. Doussière, and in "Two-dimensional control of mode size in optical channel waveguides by lateral channel tapering" by R. N. Thurston, E. Kapon and A. Shahar, Opt. Lett., Vol. 16, no. 5, March 1991. These documents describe a set of two optical rib waveguides superposed over at least part of their lengths, the transverse cross-section area of the upper waveguide decreasing in a mode transition section to couple its narrow optical mode to a broad mode which is guided by the underlying rib waveguide. This device requires one growth step but two separate lateral definition steps for the two rib waveguides, the last one involving critical alignments.

This invention aims to provide a widened output mode semiconductor optical device, which is simple to implement, is easy to fabricate and which results in only low losses of light.

This invention also aims to provide a method of manufacture of a widened output mode semiconductor optical device, which is simple to implement, is easy to fabricate and which results in only low losses of light.

SUMMARY OF THE INVENTION

According to a first aspect, the invention provides a waveguide component having a slab waveguide, a rib waveguide, and a mode transition section wherein the rib waveguide and the slab waveguide are adjacent, and wherein the rib waveguide is tapered, to provide optical coupling, and lateral confinement waveguides are provided along the slab waveguide in the mode transition section to confine light from spreading laterally. The lateral waveguides may also be rib waveguides. A rib waveguide preferably comprises a lower confinement layer having a first refractive index, a core layer having a second refractive index which is higher than the surrounding materials, an upper cladding layer having a refractive index lower than the index of the core, and a material that generally flanks the core and the cladding layers. Generally, the material of the upper cladding layer is the same as the lower confinement layer. The material flanking the cladding and the core may be the same as the cladding. In this case, the rib core is buried in the material that forms the cladding and the surrounding material.

The lateral confinement rib waveguides are significant for enabling a mode transition section which couples with low loss, which reduces the fabrication difficulties of prior art arrangements, and which is easy to implement. In particular, it reduces the need for the taper to be very fine, or the taper to be made in both vertical and horizontal axes, both of which cause fabrication difficulties.

As preferred additional features, the lateral confinement ribs can be formed in the same plane as the tapered rib, they can be formed coaxially and along both sides of the tapered rib, they can be formed on the slab, and they can be formed in the same manufacturing step as the tapered rib. If the same manufacturing step is used, there is no need for difficult precise alignment of separate steps, if a single mask is used for example. The tapered rib can be shaped so that the tapering becomes finer as the rib gets narrower. The slab waveguide can have vertical confinement by an antiresonant reflection layer having a refractive index higher than a core of the slab waveguide.

Another aspect of the invention can be summarized as a rib waveguide grown on a slab waveguide, the width of the rib waveguide decreasing in a mode transition section in which said rib waveguide is sided by two sets of confinement waveguides, grown in the same fabrication step as the central rib waveguide. The decrease in the central rib waveguide results in the coupling of its optical mode to a wider mode guided by the slab waveguide and laterally confined by the influence of the lateral waveguides.

Other aspects of the invention include methods of manufacturing the waveguide component, and applications to optical components such as semiconductor lasers, waveguide arrays for filtering, for dispersion compensation, for wavelength division multiplexing/demultiplexing, and switching, and arrays of receivers for example. This recognizes the great value that the waveguide component can bring to such applications. In particular, in wavelength division multiplexed systems, there may be tens or hundreds or more of optical paths, and so providing compact and less expensive interfaces to integrated waveguide components can be commercially valuable. Other suitable applications are semiconductor optical amplifiers, optical regenerators, optical filters, optical splitters.

How the present invention may be put into effect will now be described with reference to the appended schematic drawings. Obviously, numerous variations and modifications can be made without departing from the spirit of the present invention. Therefore, it should be clearly understood that the form of the present invention is illustrative only and is not intended to limit the scope of the present invention.

BRIEF DESCRIPTION OF THE DRAWINGS

The features of the invention will be better understood by reference to the accompanying drawings, which illustrate preferred embodiments of the invention. In the drawings.

DESCRIPTION OF THE PREFERRED EMBODIMENTS

Figure 1:
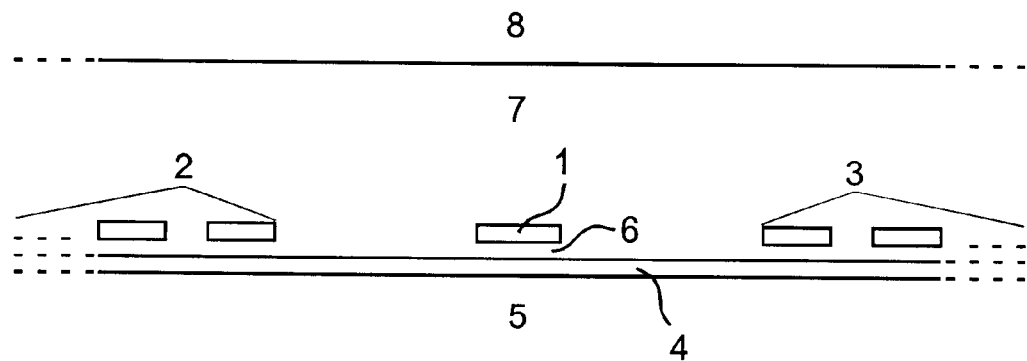
FIGS. 1 and 2 are a transverse and a longitudinal view, respectively, of a first embodiment in accordance with the present invention.
Figure 2:
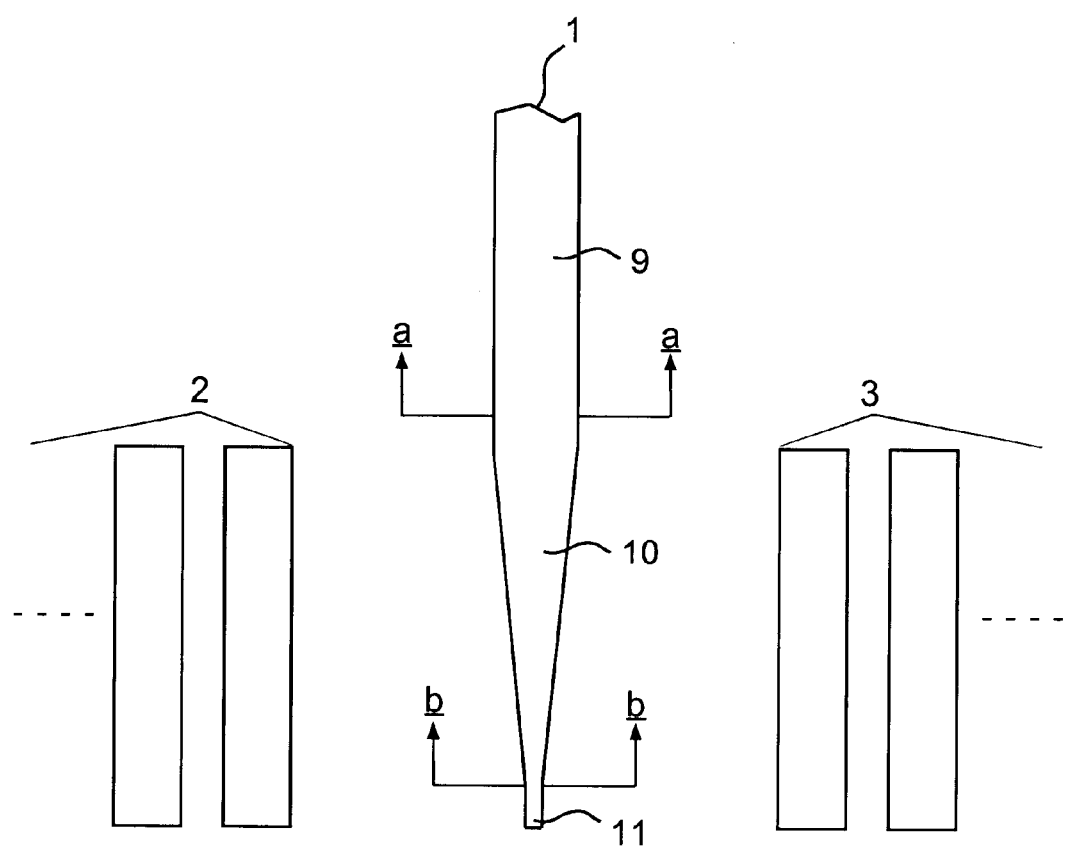

A first embodiment of the invention, illustrated in transverse and longitudinal perspective in FIGS. 1 and 2, respectively, is a semiconductor buried waveguide 1 surrounded by a set of two straight semiconductor buried waveguides 2, 3 along its tapered region 10. All of them are defined adjacent, in this example over, a slab waveguide 4. In a preferred embodiment, the lateral waveguides 2, 3 are along (or substantially along) the entire tapered region 10 and the final width 11 (as shown in FIG. 2). Alternatively, the lateral waveguides 2, 3 may cover only a portion of the tapered region 10 and the final width 11.

Referring to these arrangements, the invention comprises a vertical series of horizontal semiconductor layers which constitute the following elements:

A lower confinement layer 5 having a first refractive index.

A slab passive waveguide 4. To enable it to guide optical waves, this waveguide 4 has a refractive index which is greater than the refractive index of the surrounding materials 5, 6. This slab waveguide 4 may be also defined over the tapered waveguide 1 and the lateral waveguides 2, 3.

A separating layer 6 that in most cases is the same material as the lower confinement layer 5 and the upper cladding layer 7. This separating layer 6 may have a thickness in a range from 0 to a few microns. This thickness can be 0 microns when the slab waveguide 4 does not influence the guiding function of the tapered waveguide 1 or can improve this guiding function.

A buried waveguide 1 which can be either active or passive. When the tapered waveguide is active it may be constituted either by a number of active quantum wells and barriers or by bulk active material, but this is not critical to the invention. The material in which the central waveguide 1 is buried 7 may be the same as the lower confinement layer 5 and the separating layer 6.

Two sets of lateral buried waveguides 2, 3 surrounding the central tapered buried waveguide 1 and buried in the same material 7 as the tapered waveguide 1.

A cladding layer 7 in which the tapered 1 and the lateral waveguides 2, 3 are embedded. The material of this cladding layer 7 is usually the same as the lower confinement layer 5 and the separating layer 6.

All the layers have a substantially constant height and thickness along the invention.

In case the present invention is applied to active components such as semiconductor lasers or semiconductor amplifiers, every layer requires an electrical doping for an efficient injection of carriers into the active central waveguide. The well-known complementary materials that the operation of the laser needs, such as electrical confinement layers, contact layers, insulator layer 8 and electrodes, are not shown. In case the present invention is applied to passive components, the typical material 8 over the cladding layer 7 is air.

The central tapered rib 1 tapers from a width $W_i$ 9 to a final width $W_f$ 11. The initial width $W_i$ 9 may be the width of a standard monomode waveguide, and it will depend on the materials used in the fabrication of the present invention. In case the present invention is used integrated in a semiconductor laser, the width $W_i$ 9 will be the optimum width that provides the best lasing performance. The final width $W_f$ is narrow enough in order to provoke the total light transfer form the central waveguide 1 to the slab waveguide 4. It may be useful, to define a straight section 11 at the end of the tapered waveguide, having a width $W_f$. Said final section 11 provides a safety section in case the device has to be cleaved at the end of the tapered section 10. The shape of the tapered section 10 can follow any mathematical function, such as linear, exponential or parabolic. It is desired that said shape provides low transformation losses when spreading the light propagated by the central waveguide 1, to the adjacent slab waveguide 4.

The width that the central rib 1 has in its narrow final section $W_f$ must be both fine enough to ensure the entire guidance of the light by the underlying broad leaky mode and wide enough to avoid the difficulties of fabricating very narrow sections. Typical values are in the range 0.6–0.3 microns.

The lateral sets of buried waveguides 2, 3 may be defined along each side of the tapered waveguide section 10 and their dimensions and location may be symmetric with respect to the central tapered waveguide 1. The number of lateral waveguides 2, 3, the widths of each lateral waveguide 2, 3 and the gaps between them should be designed in order to provide the lateral confinement of the mode of the slab waveguide 4. The technological requirements for the definition of the widths of the lateral waveguides 2, 3 and the gaps between them are not critical. The typical configuration of the lateral waveguides 2, 3 is a periodic patterning of straight waveguides, with constant widths and gaps, but this is not a requirement for the present invention. They may present irregular and different widths and gaps, or even varying widths and gaps along its length. Typical values for the width of straight lateral waveguides 2, 3 and gap between them lay around the range 0.5–2 and 1–3 microns, respectively. A typical number of lateral waveguides in each side of the central tapered waveguide 1 is 3.

The gap between the inner rib waveguides of each group of lateral ribs 2, 3, is defined in order to provide high coupling efficiency to, for example, a single mode fiber. A typical value is in the range 5–10 microns.

The lateral waveguides 2, 3 may be patterned (e.g. photolithography followed by etching) in the same fabrication step as the central waveguide 1. In this case, the fabrication of the device is considerably simplified.

Figure 3:
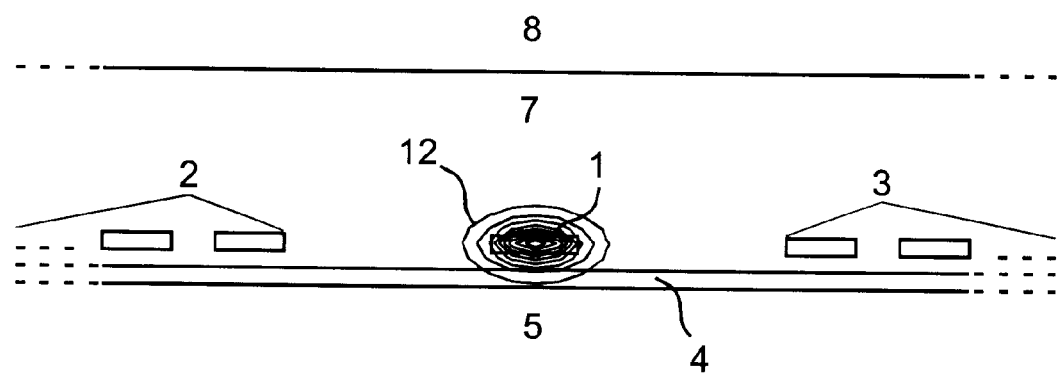
FIGS. 3 and 4 are cross-sections taken along sectional lines a—a and b—b of FIG. 2, including field contours of the confined light.
Figure 4:
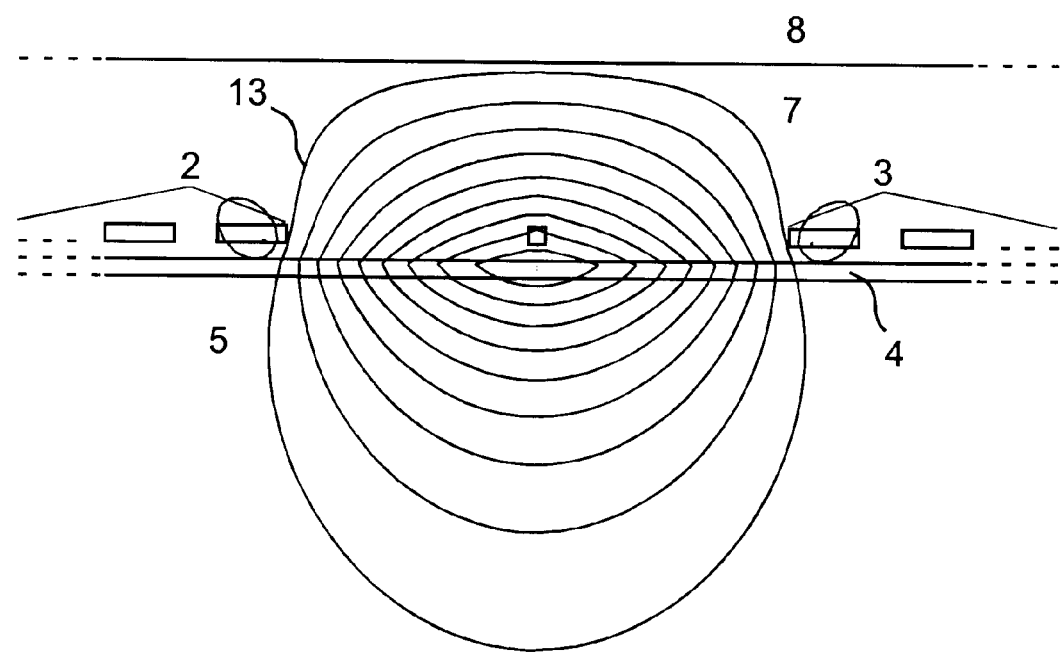

The optical field of the fundamental modes is preferably calculated for light propagating in various portions of the illustrated tapered waveguide 1. Referring to FIG. 3, there is shown a cross section of the contour lines for the electrical field at cross-section a—a of FIG. 2 (for the central rib 1 at 9 where its width of $W_i$). Further, referring to FIG. 4, there is shown a cross section of the contour lines for the electrical field at cross-section b—b of FIG. 2 (for the central rib 1 at 11 where its width of $W_f$). Each illustrated contour line represents a 10% of the maximum intensity decrease. The mode 12 is tightly confined to the central buried waveguide 1 when its width is $W_i$. For the width of the central waveguide 1 being $W_f$ the light spreads 13 in the slab waveguide 4 and its surrounding layers 5, 6. The influence of the lateral pairs of straight ribs 2, 3 causes the light traveling in the slab waveguide 4 to be confined laterally.

These diagrams show that the decrease in the width of the tapered central waveguide 1 in the taper section 10 reduces the confinement of the fundamental guided mode in the central waveguide 1 and couples the mode to the adjacent slab waveguide 4. This movement is accompanied by expansion due to the slower confinement of the slab waveguide 4 and the wider lateral confinement provided by the lateral straight ribs 2, 3. The length of the tapered section 10 should attempt to be an adiabatic transition without bringing high losses and without reaching too smooth taper angles that would cause fabrication problems.

The vertical confinement of the broadened slab mode 13 is provided by the slab waveguide defined by the slab core 4 and the surrounding materials, that is, the lower confinement layer 5 and the separating layer 6. The lateral confinement provided by the two couples of ribs 2, 3 is provided by a resonant tunneling phenomenon produced between the slab 4 fundamental mode and the modes of the lateral sets of buried waveguides 2, 3. The formed mode 13 leaks energy through the slab core 4 because it does not use total internal reflection in its lateral boundaries, but the power lost along the device is negligible compared to the modal transformation loss.

Typical values in one illustrative example in an InP substrate for the first embodiment are shown in table 1:

TABLE 1

| Part | Material | Refractive Index | Thickness (microns) |
|---|---|---|---|
| | Air | 1.0 | |
| Insulator | Polyimide | 1.7 | |
| Cladding layer | InP | 3.17 | 2.35 |
| Buried waveguides and lateral waveguides | InGaAsP (Bulk) | 3.6 | 0.35 |
| Separating layer | InP | 3.17 | 0.3 |
| Slab waveguide | InGaAsP | 3.388 | 0.04 |
| Lower confinement layer | InP | 3.17 | |

Figure 5:
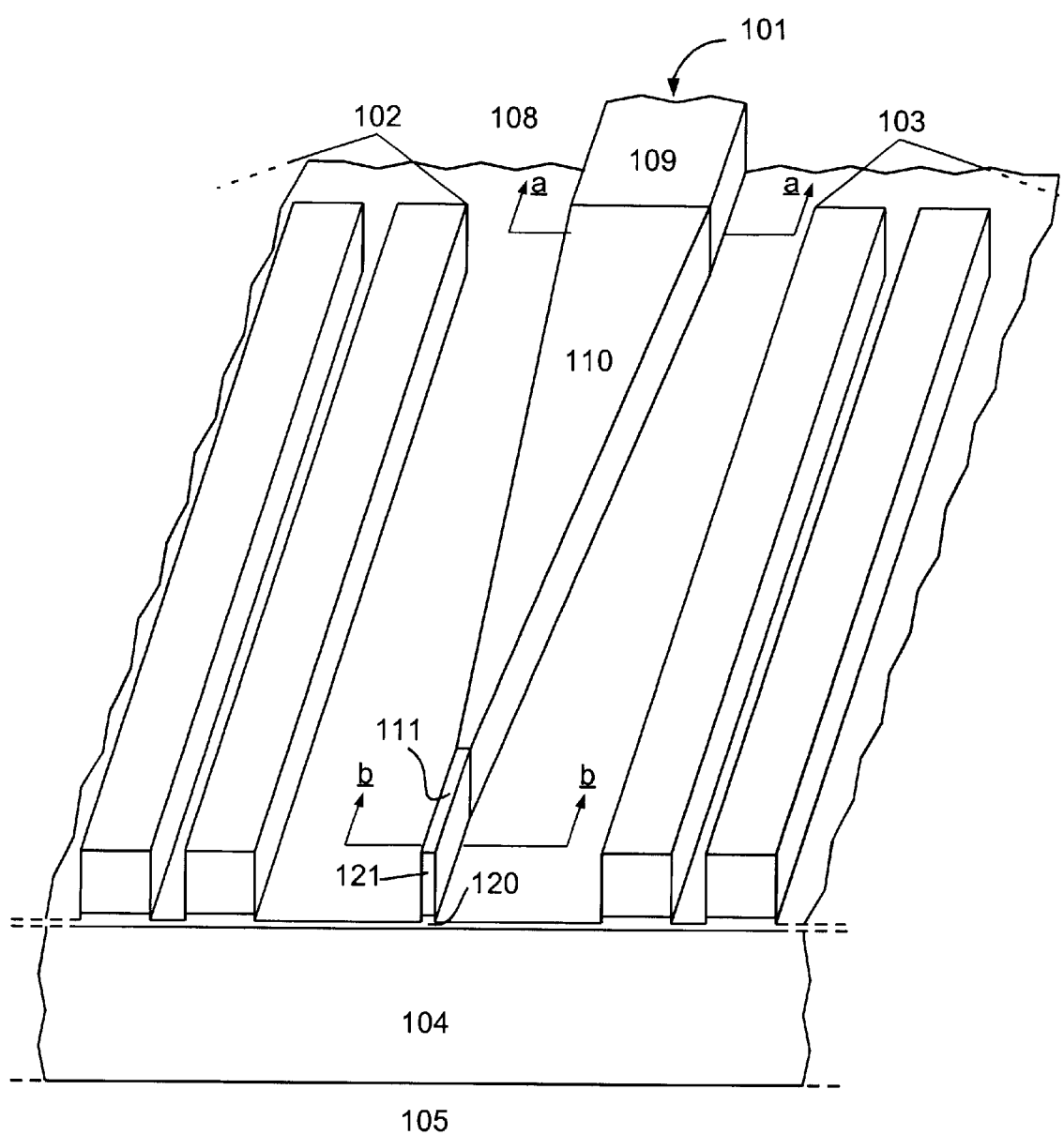
FIG. 5 shows a second embodiment in accordance with the invention in cross-section on a transverse plane.

A second embodiment of the invention is illustrated in perspective in FIG. 5. Its behavior is similar to the first embodiment. It therefore comprises elements implementing the same functions, referred to by the same terminology, and any information given hereinabove remains valid unless otherwise indicated. If an element of the second embodiment has the same function as an element of the first embodiment it is identified hereinafter by the same reference number increased by 100.

A tapered rib waveguide 101 surrounded by a two set of lateral rib waveguides 102, 103 along its tapered region and defined over a slab waveguide 104 is illustrated. We will next describe the succession of horizontal functional layers and the elements they constitute, emphasizing the differences with respect to the first embodiment.

As in the first embodiment, a first lower confinement layer 105 having a first refractive index.

A slab core layer 104. To enable it to guide optical waves, this waveguide 104 has a refractive index which is greater than the refractive index of the lower confinement layer 105.

A central tapered rib waveguide 101 comprising a core layer 120 and a cladding layer 121 and flanked in the transverse direction by a complementary material 108.

Two sets of lateral rib waveguides 102, 103 surrounding the central tapered rib waveguide 101 and flanked by the same material 108 as the central tapered waveguide 101.

The complementary material 108 that flanks the central 101 and the lateral waveguides 102, 103 may be air when the present invention is integrated with passive devices and so the core of the rib waveguides 101, 102, 103 is passive. And in the case the present invention is integrated in an active component, such a laser, the complementary material 108 might be an insulator, such as polyimide. In this case, the well known complementary materials that the operation of a laser or active component needs, are not shown.

The lateral ribs 102, 103 may be defined in the same technological step as the central one 101. In that case the fabrication is again drastically simplified.

Figure 6:
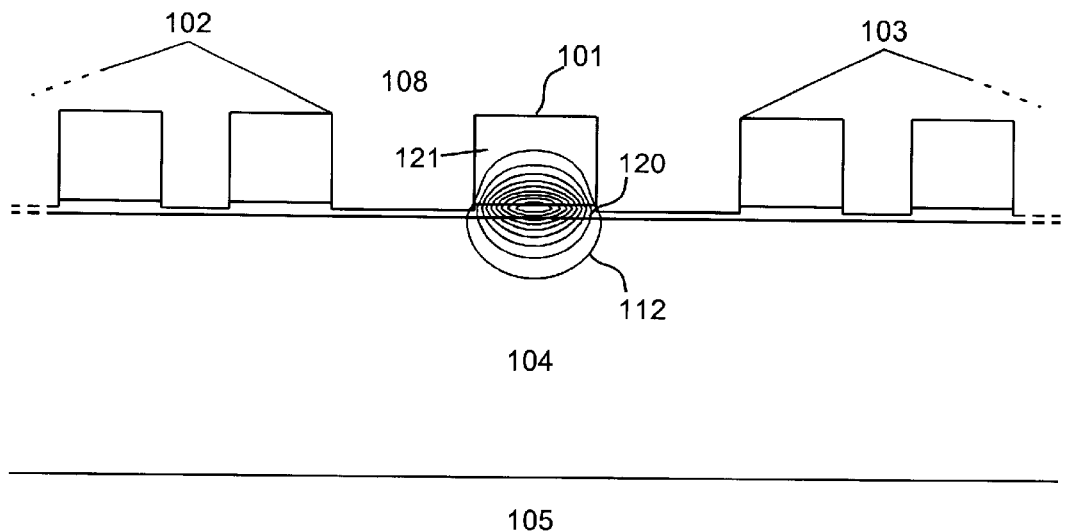
FIGS. 6 and 7 are cross-sections taken along sectional lines a—a and b—b of FIG. 5, including field contours of the confined light.
Figure 7:
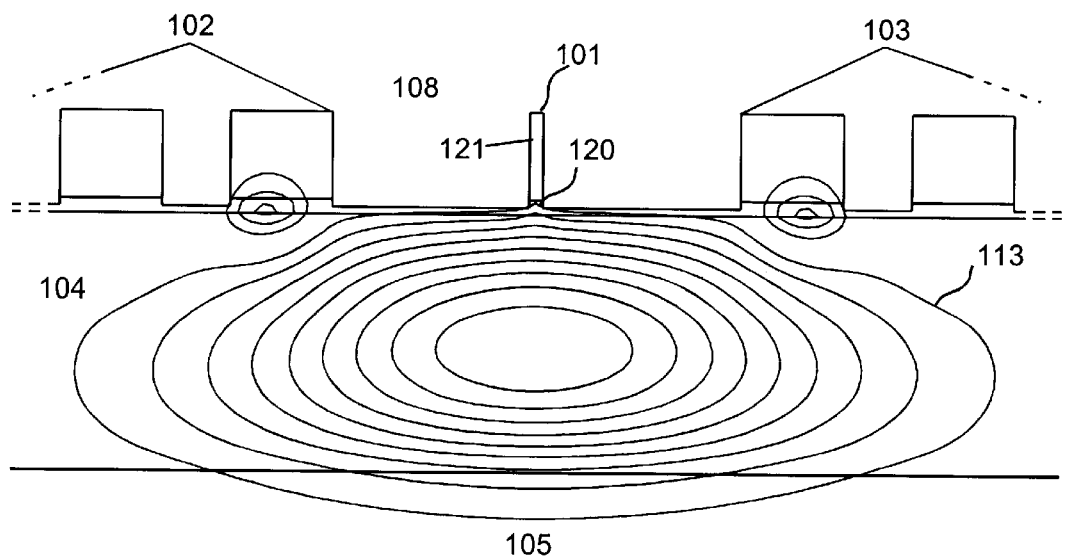

The optical field of the fundamental mode of the tapered rib 101 is calculated in the straight section of the taper 109 and at the end section of the taper 111. Referring to FIG. 6, there is shown a cross section of the contour lines for the electrical field at cross-section a—a of FIG. 5 (for the central rib 101 at 109). As shown in FIG. 6, the mode 112 is tightly confined to the upper rib 101 when it is $W_i$ wide. Referring to FIG. 6, there is shown a cross section of the contour lines for the electrical field at cross-section b—b of FIG. 5 (for the central rib 101 at 111). As shown in FIG. 7, for the rib being $W_f$ the light spreads 113 in the slab waveguide 4. The influence of the lateral pairs of straight ribs 102, 103 causes the light traveling in the slab waveguide 104 to be confined laterally.

Typical values in one illustrative example in an InP substrate for the second embodiment are shown in table 2:

TABLE 2

| Part | Material | Refractive Index | Thickness (microns) |
| --- | --- | --- | --- |
| | Air | 1.0 | |
| Insulator | Polyimide | 1.7 | |
| Cladding layer | InP | 3.17 | 1.5 |
| Core of the central and lateral rib waveguides | InGaAsP (QW's) | 3.41 | 0.2 |
| Slab waveguide | InGaAsP | 3.19 | 4 |
| Lower confinement layer | InP | 3.17 | |

Figure 8:
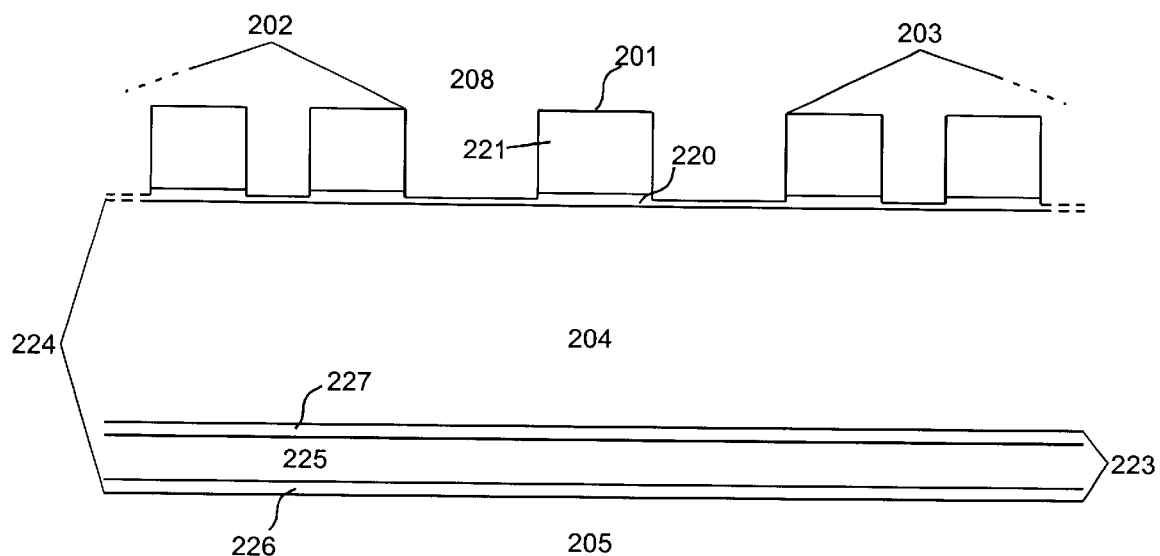
FIG. 8 is a transverse view of a third embodiment in accordance with the present invention.

A third embodiment of the invention is illustrated in the cross-section view of FIG. 8. Its behavior is identical to the second embodiment. It therefore comprises elements implementing the same functions, referred to by the same terminology, and any information given hereinabove remains valid unless otherwise indicated. If an element of the third embodiment has the same function as an element of the second embodiment it is identified hereinafter by the same reference number increased by 100.

The slab core layer 204 may have the same refractive index as the lower confinement layer 205. In that case an antiresonant reflecting element 223 may be used to provide the vertical confinement of the fundamental mode of the slab waveguide 224 (see "Antiresonant reflecting optical waveguides for III–V integrated optics" by T. L. Koch, U. Koren, G. D. Boyd, P. J. Corvini and M. A. Duguay, Electron. Let., Vol. 33, no. 5, February 1987 or EP 228886A2) in combination with the tapered central rib waveguide 201 and the lateral waveguides that provide the lateral confinement 202, 203. The antiresonant reflecting element 223 may comprise a stack of horizontal layers of different refractive indexes 225, 226, 227 in order to provide constructive interference to the propagated fundamental mode and provide its confinement. There is some amount of light leaking towards the lower confinement layer 205 but it remains negligible compared to the mode transformation losses of the invention.

Typical materials and values for the antiresonant reflecting element layers are shown in table 3:

TABLE 3

| Layer | Material | Refractive Index | Thickness (microns) |
| --- | --- | --- | --- |
| Central antiresonant layer 225 | InP | 3.17 | 1.5 |
| First antiresonant layer 226 | InGaAsP | 3.39 | 0.3 |
| Third antiresonant layer 227 | InGaAsP | 3.39 | 0.3 |

Figure 9:
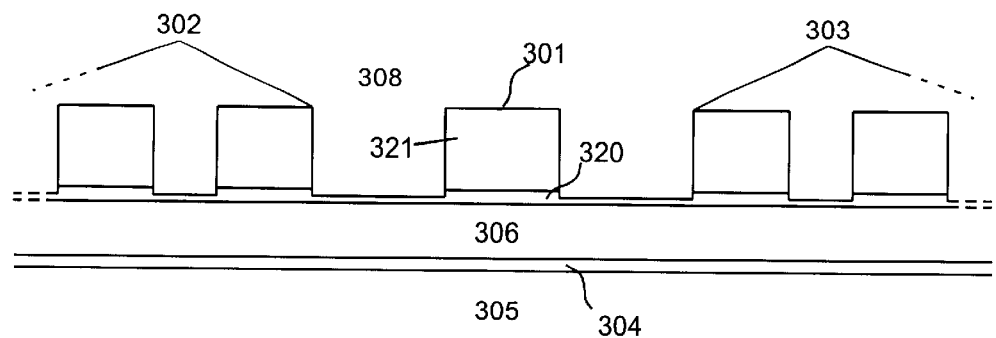
FIG. 9 is a transverse view of a fourth embodiment in accordance with the present invention.

The embodiments of FIG. 1 and FIG. 5 can be combined as illustrated in the cross-section view of FIG. 9. Its behavior is generally identical to the second embodiment. It therefore comprises elements implementing the same functions, referred to by the same terminology, and any information given hereinabove remains valid unless otherwise indicated. If an element of the fourth embodiment has the same function as an element of the second embodiment it is identified hereinafter by the same reference number increased by 200.

A tapered rib waveguide 301 surrounded by a two set of lateral rib waveguides 302, 303 along its tapered region and defined over a slab waveguide 304 is illustrated. The succession of horizontal functional layers and the elements they constitute are as follows:

A lower confinement layer 305 having a first refractive index.

A slab passive waveguide 304. To enable it to guide optical waves, this waveguide 304 has a refractive index which is greater than the refractive index of the surrounding materials 305, 306.

A separating layer 306 that in most cases is the same material as the lower confinement layer 305. This separating layer 306 may have a thickness in a range from 0 to a few microns. This thickness can be 0 microns when the slab waveguide 4 does not influence the guiding function of the tapered waveguide 301 or can improve this guiding function.

A central tapered rib waveguide 301 comprising a core layer 320 and a cladding layer 321 and flanked in the transverse direction by a complementary material 308.

Two sets of lateral rib waveguides 302, 303 surrounding the central tapered rib waveguide 301 and flanked by the same material 308 as the central tapered waveguide 301 is.

When the thickness of the separating layer 306 is 0, the present embodiment is identical to the second embodiment. Using the separating layer 306 and an appropriate thickness of the slab waveguide core 304 it is possible to obtain broader output modes which are well confined by the lateral rib waveguides 302, 303.

Figure 10:
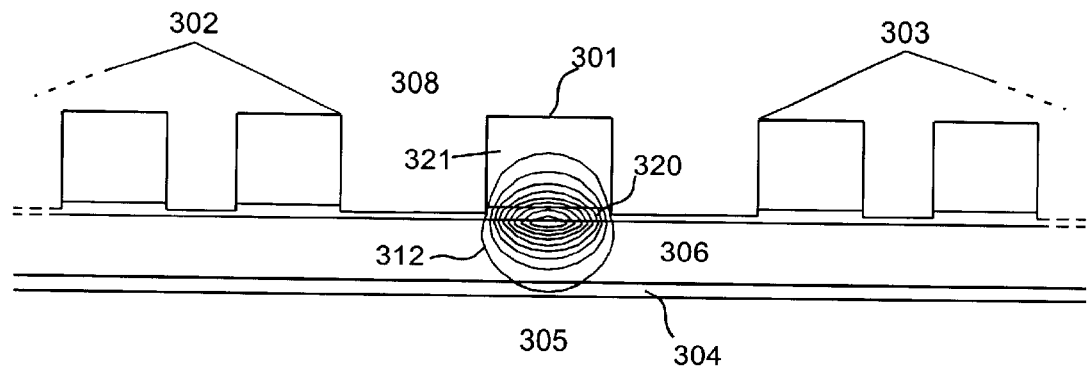
FIGS. 10 and 11 are cross-sections of the fourth embodiment including field contours of the confined light.
Figure 11:
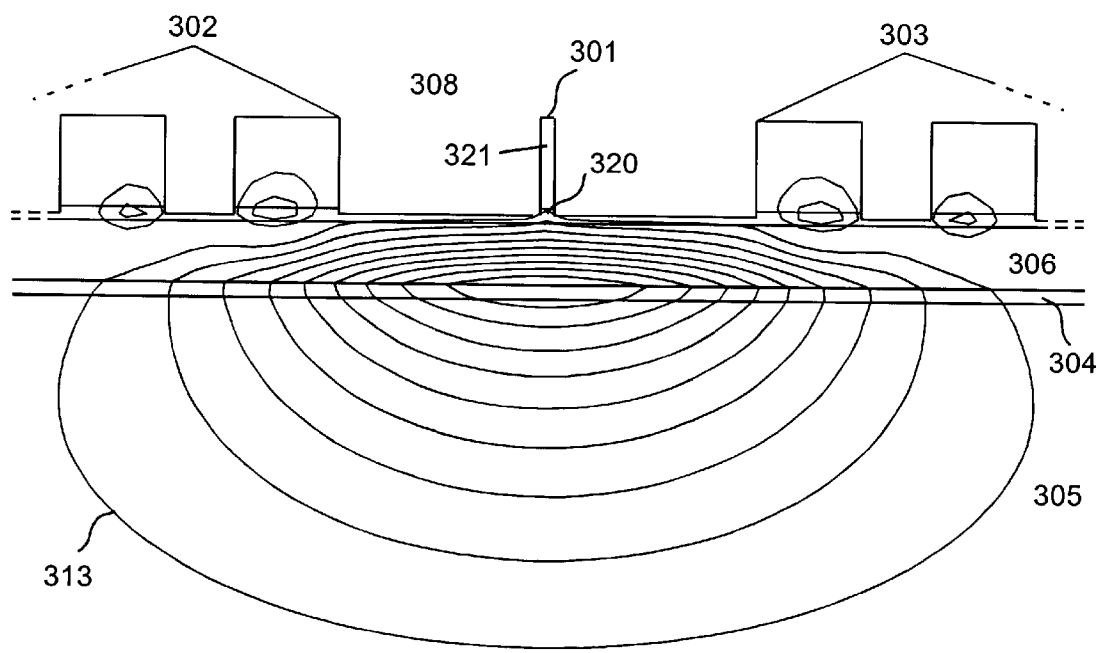

The optical field of the fundamental mode of the tapered rib 301 is calculated in the straight section of the taper and at the end section of the taper. Referring to FIG. 10, there is shown the contour lines for the electrical field at cross-section for the central rib 301 at its width $W_i$. The mode 312 is tightly confined to the upper rib 301 when it is $W_i$ wide. Referring to FIG. 11, there is shown the contour lines for the electrical field at cross-section for the central rib 301 at its width $W_f$. For the rib being $W_f$, the light spreads 313 in the slab waveguide 304. The influence of the lateral pairs of straight ribs 302, 303 causes the light traveling in the slab waveguide 4 to be confined laterally.

Typical values in one illustrative example in an InP substrate for the first embodiment are shown in table 4:

TABLE 4

| Part | Material | Refractive Index | Thickness (microns) |
| --- | --- | --- | --- |
| | Air | 1.0 | |
| Insulator | Polyimide | 1.7 | |
| Cladding layer | InP | 3.17 | 1.5 |
| Core of the central and lateral rib waveguides | InGaAsP (QW's) | 3.41 | 0.2 |
| Separating layer | InP | 3.17 | 1 |
| Slab waveguide | InGaAsP | 3.23 | 0.2 |
| Lower confinement layer | InP | 3.17 | |

Figure 12:
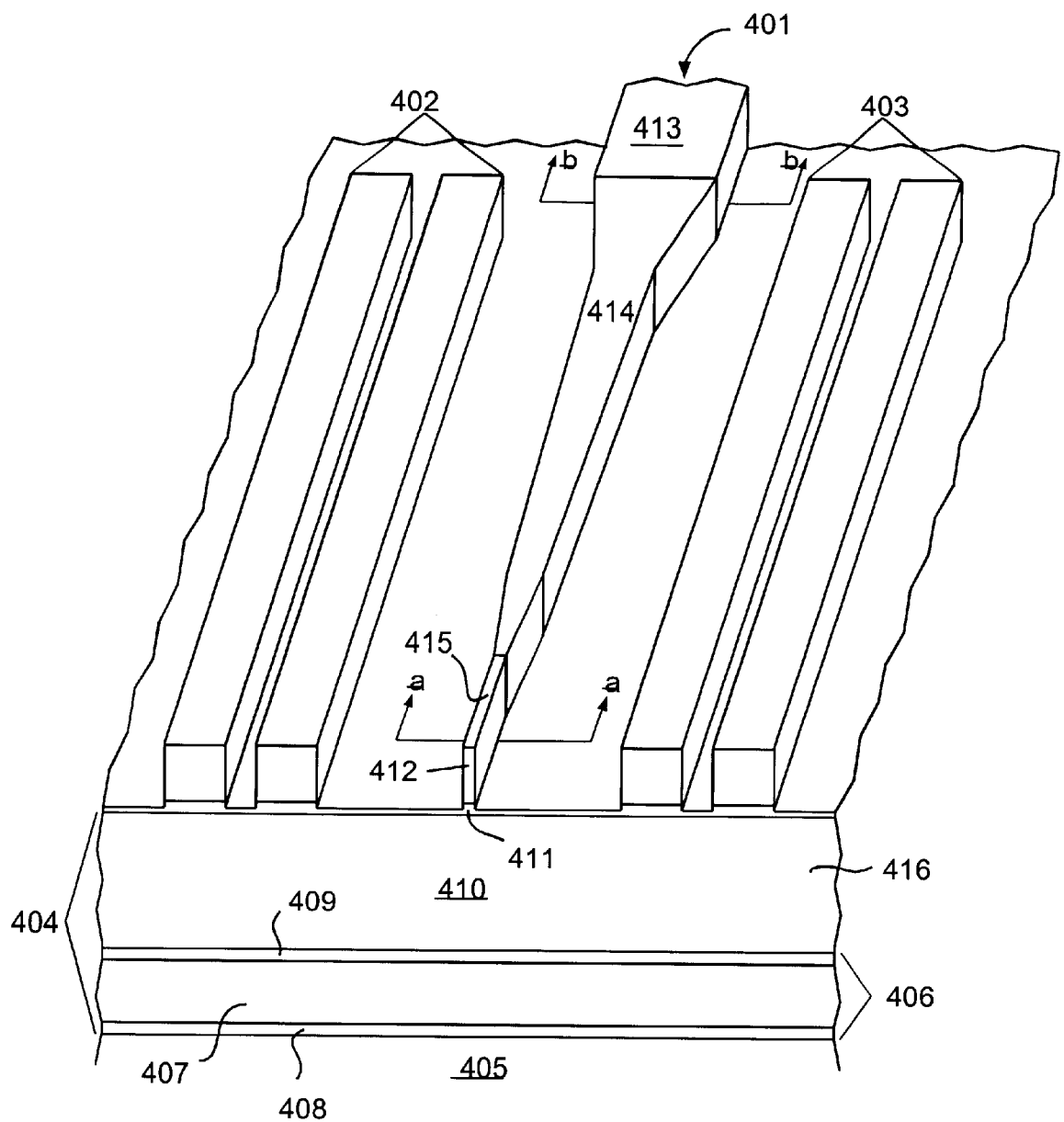
FIG. 12 is a perspective view of another embodiment in accordance with the present invention.

A fifth embodiment of the invention, illustrated in perspective in FIG. 12, is a tapered rib waveguide 401 surrounded by a set of two straight rib waveguides 402, 403 along its tapered region 414, 415, all of them grown over a thick slab waveguide 404. The thick slab waveguide 404 may have a core layer 410 with a refractive index lower than the core of the upper rib waveguides 411. A substrate 405 of InP may be used for subsequent epitaxial growth. An antiresonant reflecting element 406 may be first deposited as a vertical confinement layer, comprising a layer of InP of suitable thickness such as 1.84 $\mu$m of thickness 407, which is sandwiched by two layers of InGaAsP Q(1.3) of 0.32 $\mu$m each one 408, 409. The purpose of said antiresonant reflecting element 406 is to provide the vertical confinement of the slab mode excited at the output of the taper 416 (see "Antiresonant reflecting optical waveguides for III–V integrated optics" by T. L. Koch, U. Koren, G. D. Boyd, P. J. Corvini and M. A. Duguay, Electron. Let., Vol. 33, no. 5, February 1987). Then, the slab waveguide core layer 410 of InP is deposited to a thickness of 3.5 µm. Next an active core layer 411 to generate and guide the light in the upper central rib waveguide may be grown to a thickness of 180 nm. The active layer consists of five 1% compressively strained 80 Å-thick $In_{0.778}Ga_{0.222}As_{0.7874}P_{0.2126}$ quantum wells (QW's) for emission at 1.55 µm, and four lattice matched 150 Å-thick $In_{0.751}Ga_{0.249}As_{0.5393}P_{0.4607}$ barriers, surrounded by 400 Å-thick separate confinement heterostrucutre (SCH) regions. For this active region, an equivalent index of 3.42 was computed. On top is deposited a cladding layer 412 of InP to a thickness of 1.5 µm. The rib waveguides 401, 402, 403 are then patterned, e.g. photolithographically followed by etching the cladding and the upper core layers up to 1.54 µm. The light generating QW's layers are not reached.

Every layer requires an electrical doping for an efficient injection of carriers into the active central waveguide. The well-known complementary materials that the operation of the laser needs, such as electrical confinement layers, contact layers, insulator layer and electrodes, are not shown.

The central rib has three sections, a wide rib 413, a narrow rib 415 and a taper 414 connecting the two. The wide rib 413, where the light generation is produced, has a width of 3 µm. The narrow rib 415 has a width of 0.3 µm. The taper 414 consists of a piecewise linear device consisting of three linear sections.

The two lateral pairs of straight rib waveguides 402, 403 are defined along each side of the tapered 414 and narrow 415 sections of the central rib 401 and their dimensions and location are symmetric with respect to the central tapered guide 401. They have a width of 1.5 µm and a gap of 1 µm between the ribs of the same pair. The gap between the inner rib waveguides of each group, where the central rib is implemented, is 8 µm.

The refractive indexes for these materials are shown in Table 5.

TABLE 5

| Part | Material | Refractive Index |
| --- | --- | --- |
| | Air | 1.0 |
| Insulator | Polyimide | 1.7 |
| Upper cladding | InP | 3.17 |
| Active core (equivalent index) | (QW's) | 3.42 |
| Slab core | InP | 3.17 |
| Cladding central layer | InP | 3.17 |
| Cladding first and third layer | $In_{0.71}Ga_{0.29}As_{0.62}P_{0.38}$ | 3.39 |
| Substrate | InP | 3.17 |

The upper faces of the ribs 401, 402, 403 and slab waveguides 404 are substantially parallel to the plane of a chip, i.e. the ribs and the slab core each have a substantially constant height and thickness above the surface of the chip.

Figure 13:
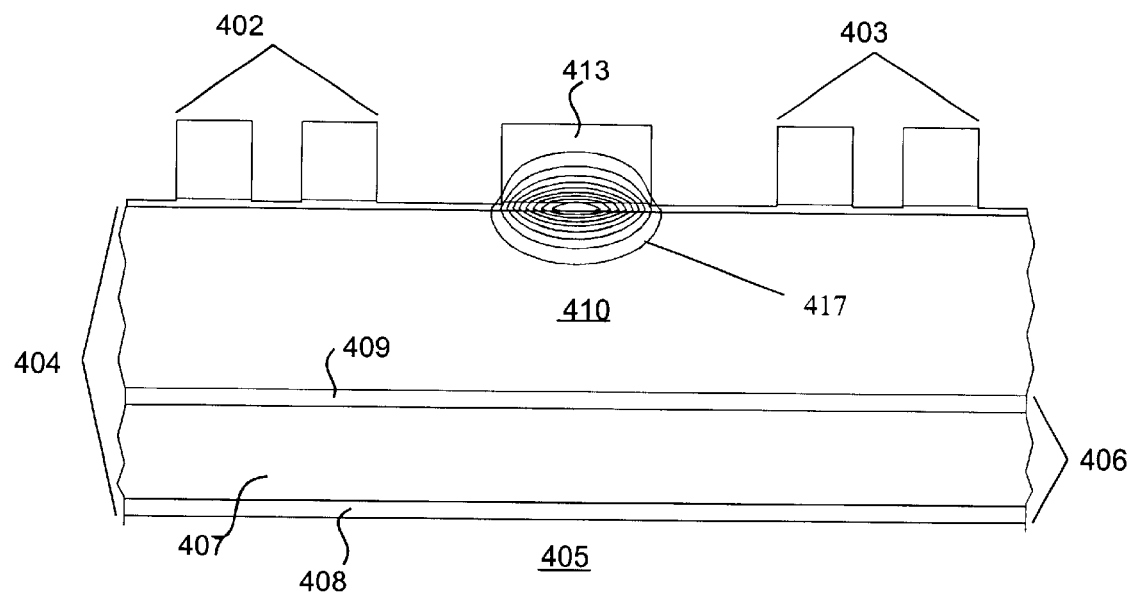
FIGS. 13 and 14 are cross-sections taken along lines a—a and b—b of FIG. 12, including field contours of the confined light.
Figure 14:
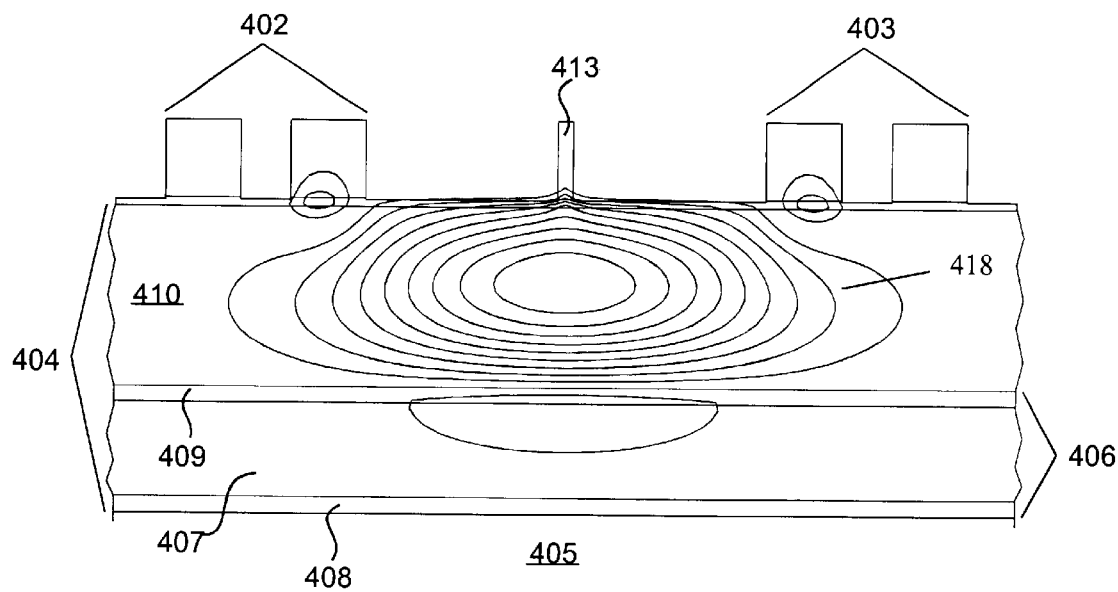

The optical field of the fundamental modes is preferably calculated for light propagating in various portions of the illustrated tapered waveguide 401. The light is preferably assumed to have a free-space wavelength of 1.55 µm, typically used in optical communication applications. The contour lines for the electrical field are illustrated in FIG. 13 for the wide central rib 413 and in FIG. 14 for the narrow central rib 415. Each illustrated contour line represents a 10% of the maximum intensity decrease. The mode 417 is tightly confined to the upper rib 401 when it is 3 µm wide. For the narrow rib the light spreads 418 in the thicker slab waveguide 404. The influence of the lateral pairs of straight ribs 402, 403 causes the light traveling in the slab waveguide 404 to be confined laterally.

These diagrams show that the decrease in the width of the active waveguide 401 in the taper section 414 reduces the confinement of the fundamental guided and amplified mode in the active waveguide 401 and couples the mode to the underlying slab waveguide 404. This movement is accompanied by expansion due to the thicker core 410 of the slab waveguide 404 and the wider lateral confinement provided by the lateral straight ribs 402, 403. The length of the tapered section 414 must be sufficient to present an adiabatic transition without bringing high losses about and without reaching too smooth taper angles that would cause fabrication problems. The three linear pieces of the taper section of the central rib waveguide preferably have a length of 100, 450 and 20 µm, over widths of 3, 1.1, 0.5 and 0.3 µm.

The vertical confinement of the broadened slab mode 418 is provided by the antiresonant character of the lower layers 406 of the structure relative to the component of propagation normal to the layers. The lateral confinement provided by the two couples of ribs 402, 403 is provided by a resonant tunneling phenomenon produced between the slab 4 modes and the upper rib 402, 403 modes. The formed mode 418 leaks energy through the substrate and the slab core 410 because it does not use total internal reflection in three of its four transversal boundaries, but the power lost along the device is negligible compared to the modal transformation loss.

Figure 15:
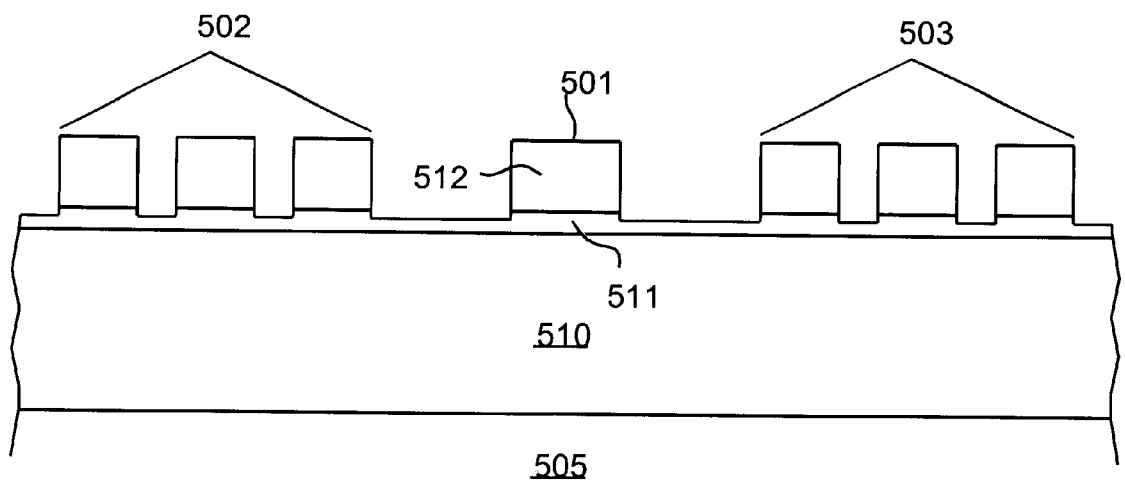
FIG. 15 shows a further embodiment in accordance with the invention in cross-section on a transverse plane.

A further embodiment of the invention is illustrated in the cross-section view of FIG. 15. Its behavior is generally identical to the previous embodiment. It therefore comprises elements implementing the same functions, referred to by the same terminology, and any information given hereinabove remains valid unless otherwise indicated. If an element of the this laser has the same function as an element of the previous layer it is identified hereinafter by the same reference number increased by 100.

In the embodiment of FIG. 15 a substrate of InP 505 has a refractive index of 3.17. A slab core layer 510 of $In_{0.97}Ga_{0.03}As_{0.064}P_{0.936}$ with a refractive index of 3.19 and 4 µm thick is the next grown layer. The upper rib core layer 511 consists of Q(1.2) over a thickness of 0.4 µm and with an index of 3.33. The final cladding of InP 512 is grown over 0.5 µm. Thereafter, an etching process defines the central tapered rib waveguide 501 and the two sets of 3 straight ribs 502, 503 in a height of 0.65 µm. The structure described in this embodiment is a passive device designed to work at wavelengths of 1.55 µm hence the layers do not need either an electrical doping or confinement layers or contact layers or insulator layer or electrodes. The two lateral sets of straight ribs 502, 503, which extend along the tapered section of the central waveguide, are separated 8 µm and have a gap of 1 µm between each pair of ribs. The central rib waveguide 501 adiabatically tapers from a section where it is 2 µm wide to another section where the width of the rib is 0.3 µm.

This embodiment does not make use of an antiresonance condition to vertically confine the broad slab mode. The means for vertical confinement is provided by the refractive index of the slab core which assures this vertical confinement. The lateral two sets of straight ribs 502, 503 implement the same function as hereinabove, but due to the thicker slab core 510 three ribs are needed to reduce the leaky losses and realize an efficient lateral confinement.

In InP technology however, it is necessary to grow low Ga and As fraction quaternary materials to get the low refractive indexes needed by the slab core 510, and in fact, they are rather difficult to grow. This problem can be overcome using the same InP slab core 510 and antiresonance vertical cladding as hereinabove or alternatively growing layers of InP and quaternary materials with higher Ga and As fractions, and thus higher refractive index, to implement a diluted core with an equivalent index as desired.

The width that the central rib 501 has in its narrow section must be both fine enough to ensure the entire guidance of the light by the underlying broad leaky mode and wide enough to avoid the difficulties of fabricating very narrow sections.

From the calculated optical fields, coupling losses to a butted optical fiber were estimated by performing a complex overlap integral with the optical mode of a standard single mode fiber. In the embodiment of FIG. 12, the tapering improved the coupling efficiency by 4.6 dB. In the embodiment of FIG. 15, the improvement reached 7.5 dB.

General Remarks to All the Embodiments:

It will be appreciated that the invention explained in both embodiments can be used in either direction, i.e. from broad slab mode to central waveguide or from small central waveguide to large slab one The previous embodiments comprise a piecewise linear taper consisting of a certain number of sections, e.g. three linear sections. Nevertheless, in some circumstances, it may be desirable to form a similar structure on a gradually curving waveguide. The shape of the rib in the taper section does not need to be straight but may also be curved.

In the preferred embodiments of the invention, the semiconductor materials are indium gallium arsenide phosphide (InGaAsP), but other semiconductor materials are also within the scope of the invention. The active material type includes bulk material or quantum wells, but again this is not critical to the invention. The fabrication method presently contemplated is metal-organic chemical vapor deposition (MOCVD), but liquid phase epitaxy (LPE), molecular beam epitaxy (MBE) and other chemical vapor deposition techniques may also be employed. The etching of the ribs may be performed by standard wet chemical etching or by reactive ion etching or other etching techniques.

The invention thus provides a simple and very easily fabricated optical device that provides efficient mode size and shape transformation and significant fiber coupling improvements.

What is claimed is:

1. A waveguide component having:
    a slab waveguide, the slab waveguide including lateral confinement waveguides,
    a rib waveguide, and
    a mode transition section,
    wherein the rib waveguide and the slab waveguide are adjacent,
    wherein the rib waveguide is tapered, to provide optical coupling, and
    wherein the lateral confinement waveguides are provided along the slab waveguide in the mode transition section to confine light from spreading laterally.

2. The waveguide component of claim 1, wherein the lateral confinement waveguides are located in a same plane as the tapered rib waveguide.

3. The waveguide component of claim 2, wherein the lateral confinement waveguides are arranged coaxially with, and along both sides of, the tapered rib waveguide.

4. The waveguide component of claim 2, wherein the lateral confinement waveguides are formed in a same manufacturing step as the tapered rib waveguide.

5. The waveguide component of claim 1, wherein the tapered rib waveguide has tapering which becomes finer as the rib becomes narrower.

6. The waveguide component of claim 1, wherein the slab waveguide includes an antiresonant reflection layer for vertical confinement of light in the slab waveguide.

7. The waveguide component of claim 1, wherein the lateral confinement waveguides comprise sets of rib waveguides symmetrically placed with respect to the tapered rib waveguide.

8. The waveguide component of claim 1, further comprising a substrate,
    wherein the slab waveguide has a refractive index higher than a refractive index of the substrate, and
    wherein the slab waveguide refractive index is lower than a refractive index of the tapered waveguide.

9. An active waveguide component having the waveguide component of claim 1, wherein the tapered rib waveguide has an active core, coupled to an electrode, the substrate, slab waveguide and tapered rib waveguide having an electrical doping, the waveguide component having a substrate coupled to another electrode.

10. An integrated waveguide component having an array of optical elements, and interfaces from each component to a respective fiber, or to another component, at least some of the interfaces having the waveguide component of claim 1.

11. A terminal for a wavelength division multiplexed optical network, having an array of transmitters or receivers each having the waveguide component of claim 1.

12. A node for an optical network having a number of the integrated waveguide components of claim 10.

13. A tapered rib waveguide, comprising:
    a substrate;
    a slab waveguide horizontally formed on said substrate;
    a tapered rib formed on said slab waveguide;
    two sets of rib waveguides formed on said slab waveguide longitudinally surrounding said tapered rib along a finite part of the length of said tapered rib and formed in the same fabrication step as said tapered rib.

14. A tapered rib waveguide according to claim 13, wherein said sets of rib waveguides are symmetrically placed with respect to said tapered rib.

15. A tapered rib waveguide according to claim 14, wherein said sets of rib waveguides are straight.

16. A tapered rib waveguide according to claim 15, wherein each set of said sets of rib waveguides has its waveguides periodically placed.

17. A tapered rib waveguide according to claim 13, wherein said tapered waveguide has an active core, said tapered waveguide covered by a metallic electrode and flanked in the lateral directions by an isolator material, said substrate, slab waveguide and tapered waveguide presenting a convenient electrical doping, said substrate having an electrode.

18. A tapered rib waveguide according to claim 13, wherein said tapered waveguide has a passive core.

19. A tapered rib waveguide according to claim 13, wherein said slab waveguide is formed by a material having a refractive index higher than the substrate, and
    wherein said slab waveguide refractive index is lower than a refractive index of said tapered waveguide.

20. A tapered rib waveguide according to claim 13, wherein said slab waveguide is formed by alternation of different materials having different refractive indexes.

21. A tapered rib waveguide according to claim 13, wherein the slab waveguide has a core, and
    wherein said slab waveguide is formed by forming a set of antiresonance reflecting structure between the substrate and the core of said slab waveguide.

* * * * *